United States Patent [19]

Matsui et al.

[11] Patent Number: 4,847,847
[45] Date of Patent: Jul. 11, 1989

[54] SEMICONDUCTOR LASER ARRAY

[75] Inventors: Sadayoshi Matsui; Mitsuhiro Matsumoto, both of Tenri; Mototaka Taneya, Ibaragi, all of Japan

[73] Assignee: Sharp Kabushiki Kaisha, Osaka, Japan

[21] Appl. No.: 105,255

[22] Filed: Oct. 7, 1987

[30] Foreign Application Priority Data

Oct. 7, 1986 [JP] Japan .................. 61-238236

[51] Int. Cl.$^4$ ............................................. H01S 3/19
[52] U.S. Cl. ..................................... 372/50; 372/45; 372/46; 372/48; 372/108
[58] Field of Search ................. 372/50, 48, 45, 46, 372/108

[56] References Cited

FOREIGN PATENT DOCUMENTS 2176939 1/1987 United Kingdom .............. 372/50

OTHER PUBLICATIONS

Welch et al., "In-Phase Emission From Index Guided Laser Array Up to 400 mM", Electronics Letters, Mar. 13, 1986, vol. 22, No. 6, pp. 293-294.
Taneya et al., "0° Phase Mode Operation in Phased-Array Lased Diode with Symmetrically Branching Waveguide", Appl. Phys. Lett., 47(4), Aug. 15, 1985, pp. 341-343.

Primary Examiner—William L. Sikes
Assistant Examiner—Georgia Y. Eppo
Attorney, Agent, or Firm—Birch, Stewart, Kolasch & Birch

[57] ABSTRACT

A semiconductor laser array includes a plurality of first wave guides extending from one end of the semiconductor laser array device, a plurality of second wave guides extending from the other end of the semiconductor laser array device, and coupling wave guides for coupling the second wave guide so that the two first wave guides are confronted. The coupling wave guides have asymmetrically divided connecting points so that the laser beam is prevented from centralizing towards the wave guides located close to the center of the semiconductor laser array.

17 Claims, 4 Drawing Sheets

SEMICONDUCTOR LASER ARRAY

BACKGROUND OF THE INVENTION

1. Field of the Invention

The embodiments of the present invention relate to a semiconductor laser array and, more particularly, to a structure for a semiconductor laser array of a phase synchronized type.

2. Description of the Prior Art

A practical maximum output of a single semiconductor element is about 50 mW. A semiconductor laser array, which has a plurality of semiconductors that are aligned on a single semiconductor substrate, is proposed in order to create a high power semiconductor laser.

FIGS. 1(A) and 1(B) show the beam intensity distribution and the index distribution, respectively, of the conventional semiconductor laser array. Generally, an oscillation mode can be selected so that each guide is synchronized with a 0°-phase different to each other guide in a semiconductor laser array. Whereby a plurality of index guide semiconductor lasers may be coupled to each other through, for example, Y-shaped division guides. However, in the conventional device, the beam intensity distribution on the mirror surface is not uniform as shown in FIG. 1(A). In particular, the guide of the central portion emits greater power beam than the guide of the end portion. Accordingly, the practical maximum power of the conventional semiconductor laser array does not become N-times greater than semiconductor laser even when an N-number of semiconductor lasers are aligned on a single semiconductor substrate. The number of the semiconductor lasers on the substrate should be maintained as low as possible because the driving current increases as the number of the semiconductor lasers increase. The driving current creates a heat problem, and the operating life period of the semiconductor laser device is adversely affected.

OBJECTS AND SUMMARY OF THE INVENTION

Accordingly, an object of the present invention is to provide a semiconductor laser array which ensures a substantially uniform output power at the mirror surface thereof.

Another object of the embodiments of the present invention is to provide a semiconductor laser array which enhances the effective output power for the laser.

Other objects and further scope of applicability of the present invention will become apparent from the detailed description given hereinafter. It should be understood, however, that the detailed description and specific examples, while indicating preferred embodiments of the present invention, are given by way of illustration only, since various changes and modifications within the spirit and scope of the invention will become apparent to those skilled in the art from this detailed description.

SUMMARY OF THE INVENTION

To achieve the above objects, pursuant to an embodiment of the present invention, a plurality of index guides are aligned on a single semiconductor substrate so that the adjacent guides confront each other with a half period shift in order to form a semiconductor laser array. The confronting guides are smoothly coupled to each other with division guides. The division ratio of each for the division guides is asymmetrical. More specifically, the division path of the outer side has a greater width than the division path of the inner side.

Thus, the above formed semiconductor laser array emits a laser beam of substantially uniform power over each guide located at the mirror surface when the array oscillates at the 0-phase synchronization mode.

BRIEF DESCRIPTION OF THE DRAWINGS

The embodiments of the present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 2:
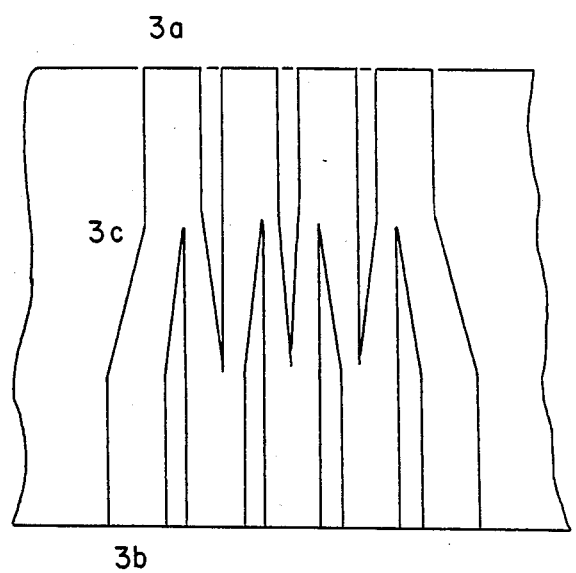
FIG. 2 is a plan view of index guides of an embodiment of the present invention for a semiconductor laser array.
Figure 4:
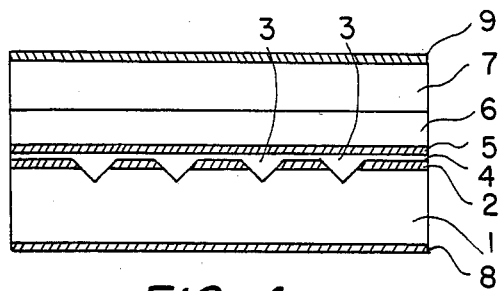
FIG. 4 is a sectional view of an embodiment of the present invention for a semiconductor laser array.

FIG. 2 shows an index guide structure in an embodiment of the present invention for a semiconductor laser array, and FIG. 4 shows a sectional structure of the embodiment for the semiconductor laser array. In particular, FIG. 4 shows the sectional structure of the semiconductor laser array when the present embodiment is employed in the semiconductor laser array of the GaAs-GaAlAs type.

On a p-GaAs substrate 1, an n-GaAs current blocking layer 2 is formed by a crystal growth method such as an LPE (Liquid Phase Epitaxial growth) method. V-shaped grooves 3 are formed in the current blocking layer 2, by the use of a and etching method, so that the V-shaped grooves 3 reach the substrate 1. Thus, the V-shaped grooves 3 that are formed function as the current path. The V-shaped grooves 3 are formed in a pattern as shown in FIG. 2. That the V-shaped grooves 3 have parallel groove regions 3a and 3b, and coupling regions 3c that are disposed between the parallel regions 3a and 3b so as to smoothly connect the confronting regions 3a and 3b with each other. FIG. 2 shows the upper surface pattern of the V-shaped grooves 3.

Then, a p-$Al_xGa_{1-x}As$ clad layer 4 is formed over the substrate 1 and the current blocking layer 2 by an LPE method. A p- or n-$Al_yGa_{1-y}As$ active layer 5 is formed on the p-clad layer 4, and an n-$Al_xGa_{1-x}As$ clad layer 6 is formed on the active layer 5, by the use of an LPE method, in order to form the active layer 5 of the double-hetero-junction structure. The value x of the clad layers 4 and 6 is greater than the value y of the active layer 5. An $n^+$-GaAs cap layer 7 is grown on the n-clad layer 6, and the multi-layered crystal structure is thereby formed for laser emission. A p-type electrode 8 is formed on the bottom surface of the substrate 1, and an n-type electrode 9 is formed on the cap layer 7. Thus, the formed semiconductor body is cleaved at a right angle to the grooves 3 to form a semiconductor laser array having a cavity length between 200 and 300 μm.

An $Al_2O_3$ film or an amorphous Si film is formed on both cleaved surfaces by the use of an electron beam evaporation method, thereby forming laser mirror surfaces. By controlling the thickness of single $Al_2O_3$ layer or multi-layers of $Al_2O_3$ and amorphous Si, the reflection factor is selected at a desired value within a range from about 2% to 95%. The coating film formed on the front mirror is preferred to be made of a single $Al_2O_3$ film having a thickness of $\lambda/4$ (where $\lambda$ is laser wavelength), and the coating film formed on the rear mirror is preferred to be made of multi-layers consisting of $Al_2O_3$ films and amorphous Si films in order to obtain a high power emission. In a preferred form, the front mirror has a reflectance of about 2%, and a rear mirror has the reflectance of about 95%.

The coupling regions 3c of the wave guide have an asymmetric shape as shown in FIG. 2. More specifically, each coupling region 3c is divided two ways with each way having a different width from the other. One way is positioned on the outer side of the device and has a wider guide than the other one that is positioned at the center of the device. The asymmetrical structure functions to distribute the laser power, and to prevent the laser output to the wave guides positioned close to the center of the array from centralizing. The semiconductor laser array of the present embodiment shows the beam intensity distribution in FIG. 3(A).

Figure 5:
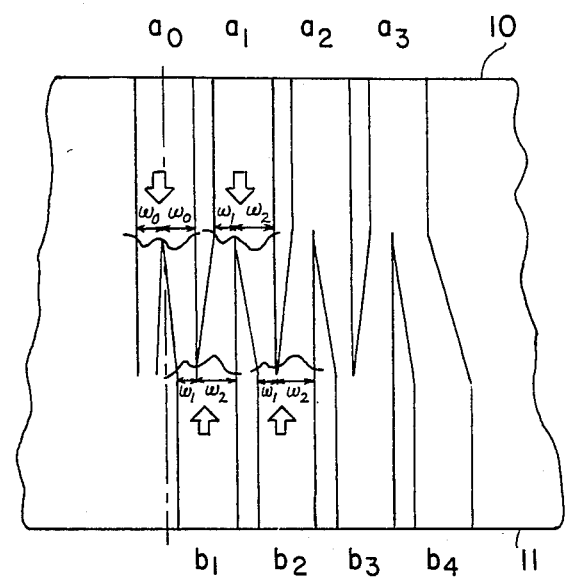
FIG. 5 is a plan view of the index guides of FIG. 2 for explaining the operational principle of the semiconductor laser array of an embodiment of the present invention.

The operational principle of the asymmetric wave guide will be described with reference to FIG. 5 and assuming that a wave guide $a_0$ is positioned at the center of the semiconductor laser array device. Accordingly, a wave guide $a_3$ is located closer to one edge of the semiconductor laser array device than a wave guide $a_1$. Wave guides $b_1$ through $b_4$ confront the wave guides $a_0$ through $a_3$. The wave guide $b_4$ is the wave guide located at the closest position to the edge of the semiconductor laser array device. The coupling portion of the wave guides has the two divided wave guides. Each of two wave guides connected to the center wave guide $a_0$ has the same width $w_0$ as the other. However the remaining coupling portions have coupling points of asymmetric widths. Each coupling point that is closer to the center of the semiconductor laser array device has a width $w_1$ which is narrower than a width $w_2$ of the other coupling point that is closer to the end of the semiconductor laser device. In a preferred embodiment, the width $w_2$ is twice as wide as the width $w_1$.

The laser beam is amplified as the beam repeatedly reflects on mirror surfaces 10 and 11 and the emitted laser beam is observed at the center wave guide $a_0$. At the coupling point to the wave guide $a_0$, the laser beam is equally divided into the two wave guides having the same width $w_0$. The laser beam introduced into the wave guide $b_1$ is reflected at the mirror surface 11 and reaches the coupling point having two wave guides of widths $w_1$ and $w_2$. Because width $w_2$ is selected to be greater than width $w_1$, the laser beam electric field intensity is divided so that the wave guide located closer to the edge of the semiconductor laser array device has a higher intensity than the wave guide located closer to the center of the semiconductor laser array device. This asymmetric division is performed at each coupling point so that the laser beam is sequentially introduced into the wave guide positioned closer to the edge of the semiconductor laser array device.

Figure 1A:
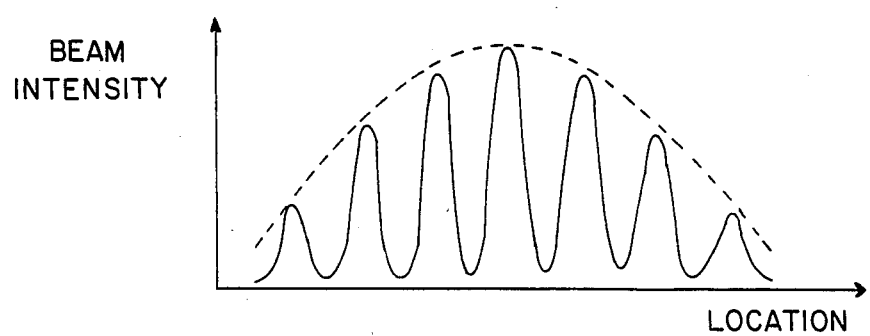
FIG. 1(A) is a graph showing the beam intensity distribution on the mirror surface of the conventional semiconductor laser array.
Figure 1B:
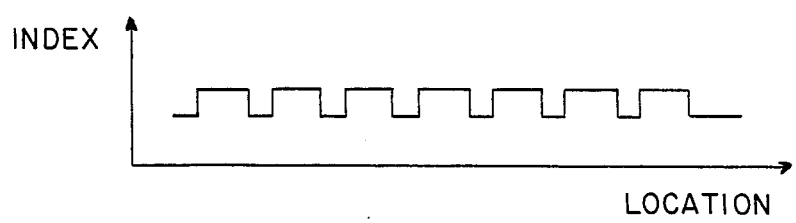
FIG. 1(B) is a graph showing the index distribution on the mirror surface of the conventional semiconductor laser array.
Figure 3A:
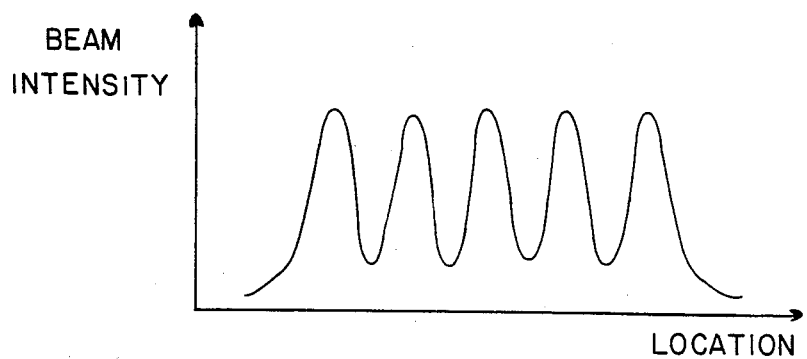
FIG. 3(A) is a graph showing the beam intensity distribution on the mirror surface of the semiconductor laser array of FIG. 2.
Figure 3B:
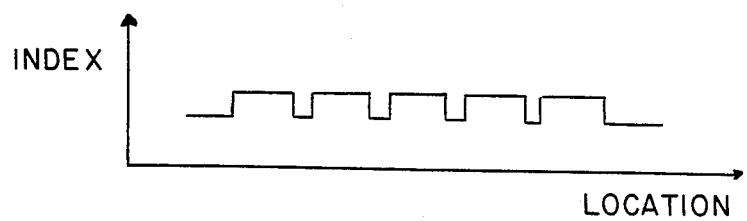
FIG. 3(B) is a graph showing the index distribution on the mirror surface of the semiconductor laser array of FIG. 2.

As already discussed, each coupling point in the conventional semiconductor laser array device is divided two ways having equal widths. Therefore, the beam intensity is distributed in a manner as shown in FIG. 1(A). Contrary to the distribution in FIG. 1(A), the semiconductor laser array device of the present embodiment has a uniform beam distribution as shown in FIG. 3(A). The uniform distribution is very effective for high power practical use.

In the foregoing embodiment, each of the wave guides other than the center wave guide $a_0$ has coupling points divided into asymmetrical ways. However, a substantially uniform distribution can be obtained by providing the asymmetric division ways at only wave guides that are located near the ends of the semiconductor laser array device. Further, the asymmetric division ratio is not limited to 1:2. The division ratio may vary depending on the distance from the center of the semiconductor laser array device. The beam output distribution at the mirror can be output in a desired pattern by controlling the division ratio.

Figure 6:
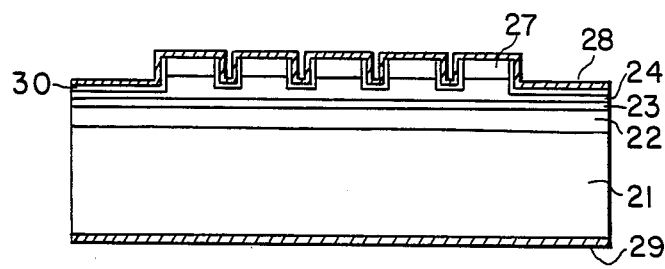
FIG. 6 is a sectional view of another embodiment of the present invention for a semiconductor laser array, which includes the ridge guide structure.
Figure 7:
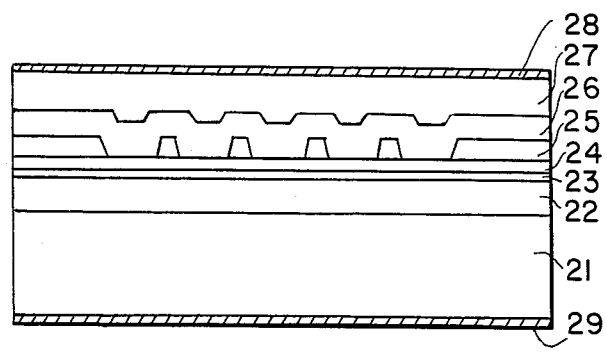
FIG. 7 is a sectional view of still another embodiment of the present invention for a semiconductor laser array, which includes the loss-index guide structure.

The idea of the embodiments of the present invention is applicable to various types of wave guides because the optical coupling caused by the evanescent waves does not affect the operating principle of the present embodiment. FIG. 6 shows another embodiment of the present invention that includes a ridge guide structure. FIG. 7 shows still another embodiment of the present invention that includes a loss-index guide structure.

The semiconductor laser array device having the ridge guide structure includes an n-GaAs substrate 21, an n-GaAlAs clad layer 22 formed on the substrate 21, an active layer 23, a p-GaAlAs clad layer 24, an insulating layer 30 for confining the electric current, a p-GaAs cap layer 27, a p-type electrode 28, and an n-type electrode 29 formed on the bottom surface of the substrate 21 as shown in FIG. 6.

The semiconductor laser array device having the loss-index guide structure includes an n-GaAs substrate 21, an n-GaAlAs clad layer 22 formed on the substrate 21, an active layer 23, a p-GaAlAs clad layer 24, an n-GaAs light absorbing layer 25, a p-GaAlAs clad layer 26, a p-GaAs cap layer 27, a p-type electrode 28 formed on the cap layer 27, and an n-type electrode 29 formed on the bottom surface of the substrate 21 as shown in FIG. 7.

The embodiments of the present invention are applicable to a semiconductor laser array that includes a buried index guide structure. Further, the semiconductor laser array device is not limited to the GaAs-GaAlAs laser, but the present embodiments are applicable to a semiconductor laser device of the InP-InGaAsP type or other types.

Therefore, the embodiments of the present invention being described as such, it will be obvious that the embodiment may be varied in many ways. Such variations are not to be regarded as a departure from the spirit and scope of the invention, and all such modifications are intended to be included within the scope of the following claims.

What is claimed is:

1. A structure for use in a semiconductor laser array comprising:
    a semiconductor substrate having first and second opposing edges;
    a plurality of first waveguides extending in parallel across said semiconductor substrate from said first edge;
    a plurality of second waveguides extending across said substrate from said second edge in parallel with each other and parallel to said first waveguides, said second waveguides being shifted for a half cycle from said first waveguides so as to interleave with said first waveguides, each said second waveguides being located intermediate to adjacent said first waveguide;
    a coupling waveguide for smoothly coupling each said second waveguide with the adjacent said first waveguide with the adjacent said first waveguide at first and second coupling points, the cross section of said coupling waveguide at said first point being narrower than the cross section at said second point.

2. A structure for use in a semiconductor laser array of claim 1, wherein said first and second wave guides and said coupling wave guide are made of an index wave guide structure.

3. The structure of claim 1 further comprising an active layer formed over said substrate, said first and second waveguides and said coupling waveguide.

4. The structure of claim 1, wherein said cross section of said coupling waveguide at said second point is twice as wide as the cross section at said first point.

5. A structure for use in a semiconductor laser array of claim 4, wherein said first and second wave guides and said coupling wave guide are of an index wave guide structure.

6. A structure in a semiconductor laser array of claim 5, wherein said semiconductor substrate comprises a GaAs substrate, and said active layer comprises an AlGaAs active layer.

7. The semiconductor laser array of claim 6, wherein said front mirror has a reflectance of 2%, and said rear mirror has a reflectance of 95%.

8. A semiconductor laser array comprising:
    a semiconductor substrate being first and second opposing edges;
    a current blocking layer formed on a portion of said substrate;
    a first clad layer formed on said current blocking layer and including,
    a plurality of first waveguides extending in parallel across said semiconductor substrate from said first edge;
    a plurality of second waveguides extending across said substrate from said second edge in parallel with each other and parallel to said first waveguides, said second waveguides being shifted for a half cycle from said first waveguides so as to interleave with said first waveguides, each said second waveguides being located intermediate to adjacent said first waveguide;
    a coupling waveguide for smoothly coupling each said second waveguide with the adjacent said first waveguide with the adjacent said first waveguide at first and second coupling points, the cross section of said coupling waveguide at said first point being narrower than the cross section at said second point;
    an active layer formed over said first clad layer;
    a second clad layer formed a said active layer;
    a cap layer formed on said second clad layer;
    a first electrode formed in said cap layer; and
    a second electrode formed on the bottom surface of said second substrate.

9. The structure of claim 8, wherein said cross section of said coupling waveguide at said second point is twice as wide as the cross section at said first point.

10. The semiconductor laser array of claim 9, wherein said coupling wave guide comprises:
    a first division wave guide connected to said one of said second wave guides in said second group at the first coupling point; and
    a second division wave guide connected to said one of said second wave guides at the second coupling point.

11. The semiconductor laser array of claim 10, wherein said said second coupling point is located closer to the center of said semiconductor laser array than said first coupling point.

12. A structure for use in a semiconductor laser array comprising:
    a semiconductor substrate having first and second edges that correspond to a predetermined length and third and fourth edges that correspond to a predetermined width;
    a first plurality of waveguides of a first width and length disposed in a top surface of said semiconductor substrate with said first length being less than one-half of said predetermined width and parallely extending from said third edge across said top surface, said first plurality of waveguides including and being centered around a central waveguide;
    a second plurality of waveguides of substantially said first width and length disposed in said top surface and parallely extending from said fourth edge across said top surface, said second plurality of waveguides being offset from said first plurality of waveguides by one-half of said first width;
    a plurality of coupling waveguides for coupling one of said first plurality of waveguides to an adjacent pair of said second plurality of waveguides, each of said plurality of coupling waveguides having a first coupling portion of a first coupling width for connecting said one first wave guide to said adjacent pair of second wave guides, said first coupling portion being closer to said central waveguide than said second coupling portion and said second coupling width being greater than said first coupling width; and
    a central coupling waveguide extending from said central waveguide having a first central coupling portion of a first central coupling width and a second central coupling portion of said first central coupling width.

13. A structure in a semiconductor laser array of claim 12, wherein said second coupling width is twice as large as said first coupling width.

14. A structure in a semiconductor laser array of claim 12, wherein a front mirror is formed on said third edge of said semiconductor substrate and a rear mirror is formed on said fourth edge of said semiconductor substrate.

15. A semiconductor laser array comprising:
a semiconductor substrate having first and second edge that correspond to a predetermined length and third and fourth edges that correspond to a predetermined width;
a current blocking layer formed on a portion of said semiconductor substrate;
a first clad layer formed on said current blocking layer and disposed in a remaining portion of said semiconductor substrate where said current blocking layer fails to exist, said first clad layer including,
a first plurality of waveguides of a first width and a first length disposed in a top surface of said semiconductor substrate with said first length being less than one-half of said predetermined width and parallely extending from said third edge across said top surface, said first plurality of waveguides including and being centered around a central waveguide of said first width and length,
a second plurality of waveguides of substantially said first width and length disposed in said top surface and parallely extending from said fourth edge across said top surface, said second plurality of waveguides being offset from said first plurality of waveguides by one-half of said first width,
a plurality of coupling waveguides for coupling one of said first plurality of waveguides to an adjacent pair of said second plurality of waveguides, each of said plurality of coupling waveguides having a first coupling portion of a first coupling width and a second coupling portion of a second coupling width for connecting said one first waveguide to said adjacent pair of second waveguides, said first coupling portion being closer to said central waveguide than said second coupling portion and said second coupling width being greater than said first coupling width,
a central coupling waveguide extending from said central waveguide having a first central coupling portion of a first central coupling width and a second central coupling portion of said first central coupling width;
an active layer disposed on said first clad layer;
a second clad layer disposed on said active layer;
a cap layer disposed on said second clad layer;
a first electrode disposed on said cap layer; and
a second electrode formed on a bottom surface of said semiconductor substrate.

16. A structure in a semiconductor laser array of claim 15, wherein a front mirror is formed on said third edge of said semiconductor substrate and a rear mirror is formed on said fourth edge of said semiconductor substrate.

17. A structure in a semiconductor laser array of claim 15, wherein said second coupling width is twice as large as said first coupling width.

* * * * *